US007205682B2

(12) United States Patent
Kuramori

(10) Patent No.: US 7,205,682 B2
(45) Date of Patent: Apr. 17, 2007

(54) INTERNAL POWER SUPPLY CIRCUIT

(75) Inventor: Bunshou Kuramori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 458 days.

(21) Appl. No.: 10/782,826

(22) Filed: Feb. 23, 2004

(65) Prior Publication Data

US 2004/0178844 A1 Sep. 16, 2004

(30) Foreign Application Priority Data

Mar. 14, 2003 (JP) ............................ 2003-069365

(51) Int. Cl.
*H02J 1/00* (2006.01)
*G11C 5/14* (2006.01)

(52) U.S. Cl. ........................................ 307/80; 365/226

(58) Field of Classification Search .................. 307/80
See application file for complete search history.

(56) References Cited

U.S. PATENT DOCUMENTS 5,305,270 A * 4/1994 Kim .......................... 365/203
5,886,569 A * 3/1999 Mitsuishi .................... 327/540
6,058,059 A * 5/2000 Huang et al. ............... 365/207
6,870,766 B2 * 3/2005 Cho et al. ............. 365/185.03

FOREIGN PATENT DOCUMENTS

JP 05-314769 11/1993
JP 07-103875 2/1995

* cited by examiner

*Primary Examiner*—Stephen W. Jackson
*Assistant Examiner*—Hal I. Kaplan
(74) *Attorney, Agent, or Firm*—Nixon Peabody LLP; Donald R. Studebaker

(57) ABSTRACT

An internal power supply circuit for a semiconductor integrated circuit includes two constant voltage generators having identical circuit topologies but generating two different constant voltages from an external power supply voltage. The lower constant voltage is selected when the external power supply voltage is below a predetermined level, the higher constant voltage is selected when the external power supply voltage is above the predetermined level, and an internal power supply voltage is generated from the selected constant voltage. The internal power supply voltage is stable over a wide flat region, but can also be raised to a higher level for stress testing of the semiconductor integrated circuit, and the higher level is also stable.

11 Claims, 6 Drawing Sheets

INTERNAL POWER SUPPLY CIRCUIT

BACKGROUND OF THE INVENTION

1. Field of the Invention

The present invention relates to an internal power supply circuit that receives an external power supply voltage and generates an internal power supply voltage for a semiconductor integrated circuit.

2. Description of the Related Art

Conventional internal power supply circuits are described in, for example, Japanese Unexamined Patent Application Publication No. 5-314769 and Japanese Examined Patent Application Publication No. 7-13875. One conventional type of internal power supply circuit comprises a first voltage generator that generates a constant voltage V1 from the external power supply voltage VCC, a second voltage generator that outputs a variable voltage V2, and a voltage combiner that outputs the higher of the two voltages V1 and V2 as the internal power supply voltage VDD.

In the first voltage generator, the external power supply voltage VCC is applied to a resistor connected in series with one or more n-channel metal-oxide-semiconductor (NMOS) transistors, and the threshold voltage of the NMOS transistors, or a multiple thereof, is output as voltage V1. More accurately, as the external power supply voltage VCC rises from the ground level, voltage V1 remains equal to the external power supply voltage VCC until VCC reaches a level high enough to turn on the NMOS transistors, which operate as diodes. Voltage V1 then remains constant at this level as the external power supply voltage rises further.

In the second voltage generator, the external power supply voltage VCC is applied to a series circuit comprising one or more p-channel metal-oxide-semiconductor (PMOS) transistors and a plurality of NMOS transistors. As the external power supply voltage VCC rises from the ground level, voltage V2 remains at the ground level until the external power supply voltage VCC is high enough to turn on the PMOS transistors, which operate as diodes. Voltage V2 then rises together with the external power supply voltage VCC, staying below the external power supply voltage VCC by a fixed amount equal to the PMOS transistor threshold voltage, or a multiple thereof.

Since the voltage combiner outputs the higher of the two voltages V1 and V2 as the internal power supply voltage VDD, as the external power supply voltage VCC rises from the ground level, the internal power supply voltage VDD stays equal to the external power supply voltage VCC until voltage V1 reaches its constant level, then remains at this constant level until voltage V2 also reaches this level. When voltage V2 exceeds the constant level of voltage V1, the internal power supply voltage VDD begins rising again, now being equal to V2.

A plot of the internal power supply voltage VDD thus shows an initial rise followed by a flat region, then a further rising region referred to as the burn-in region, because it is used to stress the semiconductor integrated circuit when the semiconductor integrated circuit is being tested or 'burned in'. The advantage of the conventional internal power supply circuit is that it can hold the internal power supply voltage steady even if the external power supply voltage VCC varies within the flat region, but can also supply a higher voltage for stress testing in the burn-in region.

One problem with this conventional internal power supply circuit is that while a stable and only slightly temperature-dependent voltage can be obtained from the first voltage generator, which relies only on the NMOS transistor threshold voltage, it is more difficult to obtain a stable voltage from the second voltage generator, which relies on the PMOS transistor threshold voltage and is more likely to be affected by temperature variations and threshold voltage variations.

Another problem is that when a semiconductor integrated circuit is designed to accommodate two external power supply voltages, such as three volts and five volts (3 V and 5 V), the second voltage generator requires further circuit elements that can be used selectively to shift the voltage point at which the transition from the flat region to the burn-in region occurs. That is, the second voltage generator must be designed for selective output of two voltages, making the problem of obtaining stable voltage output twice as difficult. In particular, it is difficult to guarantee an adequately wide flat region when the transition point to the burn-in region is shifted downward.

The reason for this problem is that since the voltage rises gradually from the transition point to the level desired for stress testing, the transition point must be considerably lower than the stress testing point. A further problem is that the internal power supply voltage can continue to rise past the stress testing point, possibly leading to damage to circuits receiving the internal power supply voltage.

SUMMARY OF THE INVENTION

An object of the present invention is to generate a stable internal power supply voltage from an external power supply voltage.

Another object is to generate an internal power supply voltage that has a comparatively wide flat region, but can also be raised for stress testing.

The invented internal power supply circuit includes a voltage detector that detects whether the external power supply voltage exceeds a predetermined voltage, a first constant voltage generator that generates a first constant voltage from the external power supply voltage, and a second constant voltage generator that generates a second constant voltage from the external power supply voltage. The first and second constant voltage generators have identical circuit topologies, but generate different constant voltages. Each of the first and second constant voltage generators comprises, for example, an NMOS transistor coupled in sequence with a pair of resistors.

A voltage switch selects either the first constant voltage or the second constant voltage under control of the voltage detector, and outputs the selected constant voltage as a reference voltage. An internal power supply output unit generates an internal power supply voltage from the external power supply voltage according to the reference voltage and outputs the internal power supply voltage.

The invented internal power supply circuit operates, for example, as follows.

When the external power supply voltage is lower than the predetermined voltage, the first constant voltage is selected and output from the voltage switch as the reference voltage. When the external power supply voltage is higher than the predetermined voltage, the second constant voltage is selected and output from the voltage switch as the reference voltage. The internal power supply output unit holds the internal power supply voltage at a constant level that depends on the reference voltage, so that after an initial rise, the internal power supply voltage has a first value when the external power supply voltage is below the predetermined value, and a second, higher, value when the external power supply voltage is above the predetermined value. The first value can be used for normal operation and the second value for stress testing.

Since the first and second constant voltage generators have identical circuit topologies, the relationship between the first and second constant voltages is not subject to temperature-dependent or threshold-dependent variations. The first and second constant voltages are particularly stable if the first and second constant voltage generators use NMOS transistors.

Since the transition from the first value to the second value of the internal power supply voltage occurs abruptly, the first value of the internal power supply voltage can be maintained over a comparatively wide flat region.

DETAILED DESCRIPTION OF THE INVENTION

Figure 1:
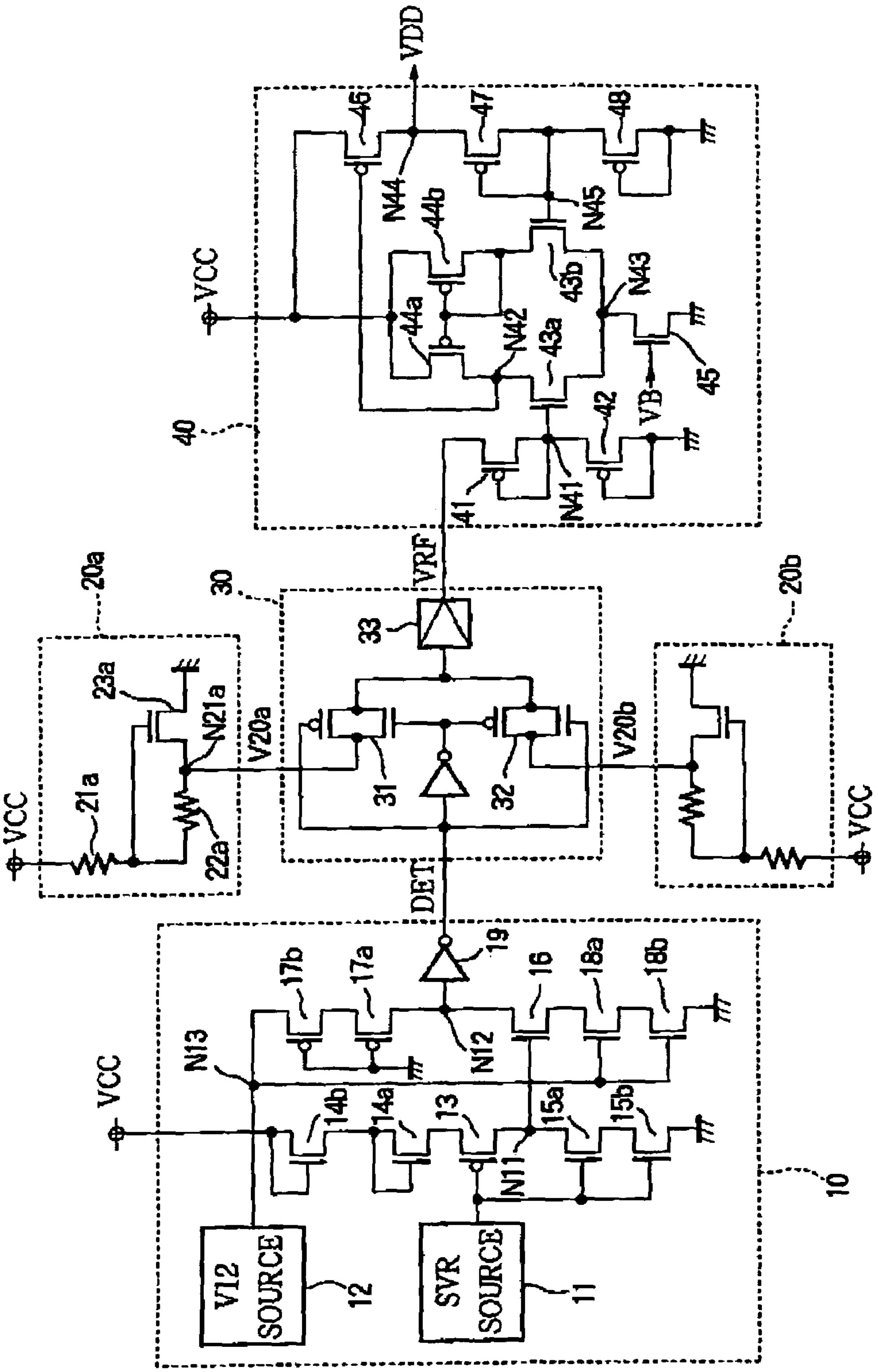
FIG. 1 is a circuit diagram of an internal power supply circuit illustrating a first embodiment of the invention.

Embodiments of the invention will now be described with reference to the attached drawings, in which like elements are indicated by like reference characters.

First Embodiment

The first embodiment is an internal power supply circuit that receives an externally provided power supply voltage VCC and generates an internal power supply voltage VDD for use in a semiconductor integrated circuit. Referring to FIG. 1, the first embodiment comprises a voltage detector 10, a pair of constant voltage generators 20*a*, 20*b*, a voltage switch 30, and an internal power supply output unit 40.

The voltage detector 10 outputs a detection signal (DET) that indicates whether the external power supply voltage VCC is greater than a predetermined voltage. The voltage detector 10 includes a reference voltage source 11 that generates a reference voltage SVR and a constant voltage source 12 that generates a constant voltage V12. The internal structure of both the reference voltage source 11 and constant voltage source 12 is similar to the structure of the constant voltage generators 20*a*, 20*b*, which will be described below.

The reference voltage SVR is supplied to the gate of a PMOS transistor 13. The source of the PMOS transistor 13 is coupled to the external power supply voltage VCC through NMOS transistors 14*a* and 14*b*, which are connected as diodes in the forward-biased direction. The drain of PMOS transistor 13 is connected to a node N11 that is coupled to the ground potential (hereinafter, simply 'ground') through NMOS transistors 15*a* and 15*b*, which are connected in series. The reference voltage SVR is also supplied to the gates of these NMOS transistors 15*a* and 15*b*.

Node N11 is also connected to the gate of an NMOS transistor 16, the drain of which is connected to a further node N12. Node N12 is coupled to a still further node N13 through PMOS transistors 17*a* and 17*b*, which are connected in series. The source of NMOS transistor 16 is coupled to ground through NMOS transistors 18*a* and 18*b*, which are connected in series. The gates of the PMOS transistors 17*a* and 17*b* are connected to ground, while the gates of the NMOS transistors 18*a* and 18*b* are connected to node N13.

The constant voltage V12 is supplied to node N13 from the constant voltage source 12. An inverter 19 connected to node N12 outputs the detection signal DET.

The voltages V20*a* and V20*b* output by constant voltage generators 20*a* and 20*b* remain constant when the external power supply voltage VCC exceeds a fixed voltage set separately for each voltage generator. Both constant voltage generators 20*a* and 20*b* have the same circuit topology: constant voltage generator 20*a*, for example, comprises resistors 21*a* and 22*a* connected in series between the external power supply voltage VCC and a node N21*a*, and an NMOS transistor 23*a* connected between node N21*a* and ground. The gate of the NMOS transistor 23*a* is connected to the point at which resistors 21*a* and 22*a* are interconnected. The constant voltage V20*a* is output from node N21*a*.

The voltage switch 30 comprises two transmission gates 31 and 32 that receive complementary on/off control by the DET signal output from the voltage detector 10, and a buffer 33 for supplying current at the voltage output from transmission gate 31 or 32 without draining the constant current source 20*a* or 20*b*. The voltage V20*a* from constant voltage generator 20*a* is supplied to the input terminal of transmission gate 31, while the voltage V20*b* from constant voltage generator 20*b* is supplied to the input terminal of transmission gate 32. When the DET signal is low, transmission gate 31 is turned on to select the voltage V20*a* from constant voltage generator 20*a*, which is output from the buffer 33 as a reference voltage VRF. When the DET signal is high, transmission gate 32 is turned on to select the voltage V20*b* from constant voltage generator 20*b*, and voltage V20*b* is output as the reference voltage VRF. The output terminal of the voltage switch 30 is coupled to the internal power supply output unit 40.

The internal power supply output unit 40 uses the reference voltage VRF output from the voltage switch 30 to generate a constant voltage in two amplification stages, and outputs the constant voltage as the internal power supply voltage VDD, corresponding to the external power supply voltage VCC. The reference voltage VRF is supplied to the source of a PMOS transistor 41 in the internal power supply output unit 40. The gate and drain of PMOS transistor 41 are connected to a node N41, to which the source of a PMOS transistor 42 is connected. The gate and drain of PMOS transistor 42 are connected to ground. Node N41 is connected to the gate of an NMOS transistor 43*a*.

NMOS transistor 43*a* has its drain connected to a node N42, and its source connected to a node N43. Node N42 is coupled to the external power supply voltage VCC through a PMOS transistor 44*a*, while node N43 is coupled to ground through an NMOS transistor 45. Node N43 is also coupled to the external power supply voltage VCC through an NMOS transistor 43*b* and a PMOS transistor 44*b*, which are connected in series. The gates of PMOS transistors 44*a* and 44*b* and the drain of PMOS transistor 44*b* are connected to the drain of NMOS transistor 43*b*. A bias voltage VB is supplied to the gate of NMOS transistor 45, causing it to conduct a constant current. PMOS transistors 44*a* and 44*b* and NMOS transistors 43*a*, 43*b*, and 45 constitute a differential amplifier circuit.

Node N42 is connected to the gate of a PMOS transistor 46; the source of PMOS transistor 46 is connected to the external power supply voltage VCC; the drain of the PMOS transistor 46 is connected to a node N44. Node N44 is connected to the source of a PMOS transistor 47; the drain and gate of PMOS transistor 47 are connected to a node N45, which is connected to the gate of NMOS transistor 43*b* and the source of a PMOS transistor 48. The drain and gate of PMOS transistor 48 are connected to ground. The internal power supply voltage VDD is output from node N44.

Figure 2:
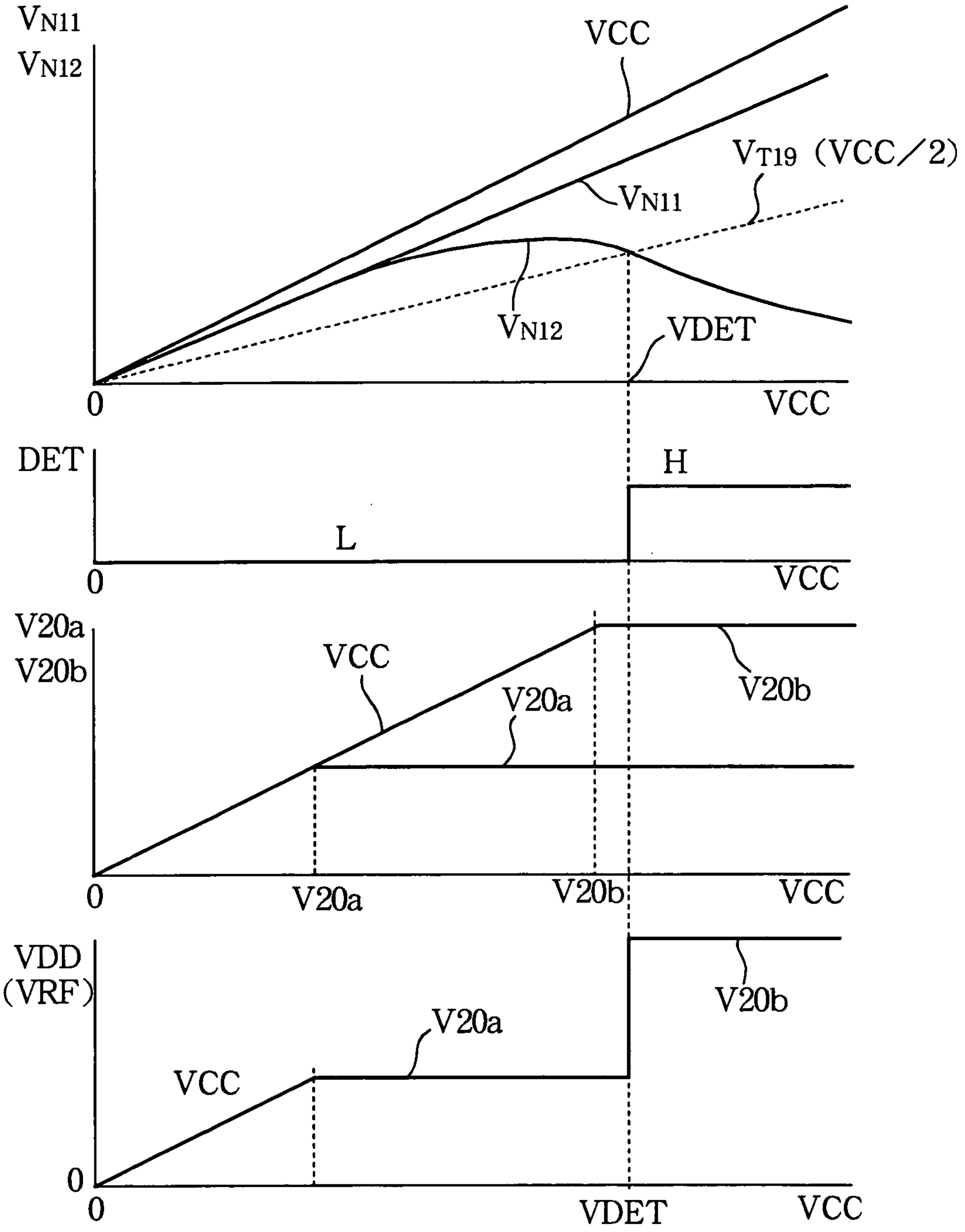
FIG. 2 is a signal waveform diagram illustrating the operation of the circuit in FIG. 1.

The operation of the internal power supply circuit in FIG. 1 will be described below with reference to the waveform diagram in FIG. 2.

In the voltage detector 10, the reference voltage SVR is output at a desired voltage level from the reference voltage source 11 to the gate of PMOS transistor 13. When the external power supply voltage VCC rises, the voltage level VN11 at node N11 and the voltage level VN12 at node N12 at first rise in proportion, as shown at the top in FIG. 2. As the drain-source voltage Vds of PMOS transistor 13 increases, however, its drain current Ids increases, further raising the voltage level VN11 at node N11, and decreasing the on-resistance of NMOS transistor 16. The voltage level VN12 at node N12 then decreases.

When the voltage level VN12 at node N12 drops below the switching threshold voltage VT19 of inverter 19, which is half the external power supply voltage VCC, the detection signal DET switches from low (L) to high (H), as indicated by the DET waveform in FIG. 2. The value of the external power supply voltage VCC at this point is the detection threshold voltage VDET of the voltage detector 10. Conversely, if the external power supply voltage VCC later decreases from a level higher than the detection threshold voltage VDET of the voltage detector 10 to a level lower than VDET, the detection signal DET switches from high to low.

The detection threshold voltage VDET is determined by the constant voltage V12 and reference voltage SVR. These voltages V12 and SVR are set so that the detection threshold voltage VDET is higher than both of the constant voltages V20*a* and V20*b* output by the constant voltage generators 20*a* and 20*b*.

Constant voltage generator 20*a* outputs a voltage equal to the external power supply voltage VCC until the external power supply voltage VCC reaches the constant voltage V20*a*. When the external power supply voltage VCC exceeds the constant voltage V20*a*, the output of constant voltage generator 20*a* remains constant at V20*a*, as indicated by the V20*a* and waveform in FIG. 2. Similarly, the output of voltage generator 20*b* follows VCC until a higher constant voltage V20*b* is reached, and then remains constant at this voltage V20*b*.

As long as the external power supply voltage VCC does not exceed the detection threshold voltage VDET, the detection signal DET received by the voltage switch 30 remains low, so the voltage V20*a* generated by constant voltage generator 20*a* is power-amplified by the buffer 33 and output as the reference voltage VRF. When the external power supply voltage VCC exceeds the detection threshold voltage VDET, the detection signal DET goes high, so the voltage V20*b* generated by constant voltage generator 20*b* is output as the reference voltage VRF.

The reference voltage VRF output from the voltage switch 30 is supplied to the internal power supply output unit 40, where it is amplified and then output from node N44 as the internal power supply voltage VDD. As shown at the bottom of FIG. 2, the VDD (or VRF) waveform has a step-like appearance with a wide flat region from voltage V20*a* to the detection threshold voltage VDET, in which the internal power supply voltage VDD remains constant at V20*a*, and another flat region above the detection threshold voltage VDET, in which the internal power supply voltage remains constant at V20*b*.

As described above, the internal power supply circuit in the first embodiment includes an internal power supply output unit 40 and a voltage switch 30 that selects one of two voltages V20*a* and V20*b* generated by constant voltage generators 20*a* and 20*b* having the same circuit topology, according to a detection signal DET. Since the constant voltage generators 20*a* and 20*b* have the same circuit topology and use only NMOS transistors, the relationship between the two constant voltages V20*a* and V20*b* does not vary due to PMOS transistor threshold voltage variations. With this arrangement, an internal power supply voltage VDD can be obtained with little dependence on temperature or circuit parameter variations.

The upper flat region, in which the internal power supply voltage is equal to the higher constant voltage V20*b*, is used as a burn-in region for stress testing. The abrupt step-like transition to the burn-in region from the lower flat region enables the lower flat region to be widened, as compared with the prior art in which the internal power supply voltage rises gradually in the burn-in region. A greater operating margin at the high voltage end of the flat region can therefore be obtained than in the prior art.

A further advantage of the first embodiment is that since the internal power supply voltage remains constant in the burn-in region, internal circuits are protected from possible damage due to the application of a power supply voltage higher than the stress testing level.

Second Embodiment

Figure 3:
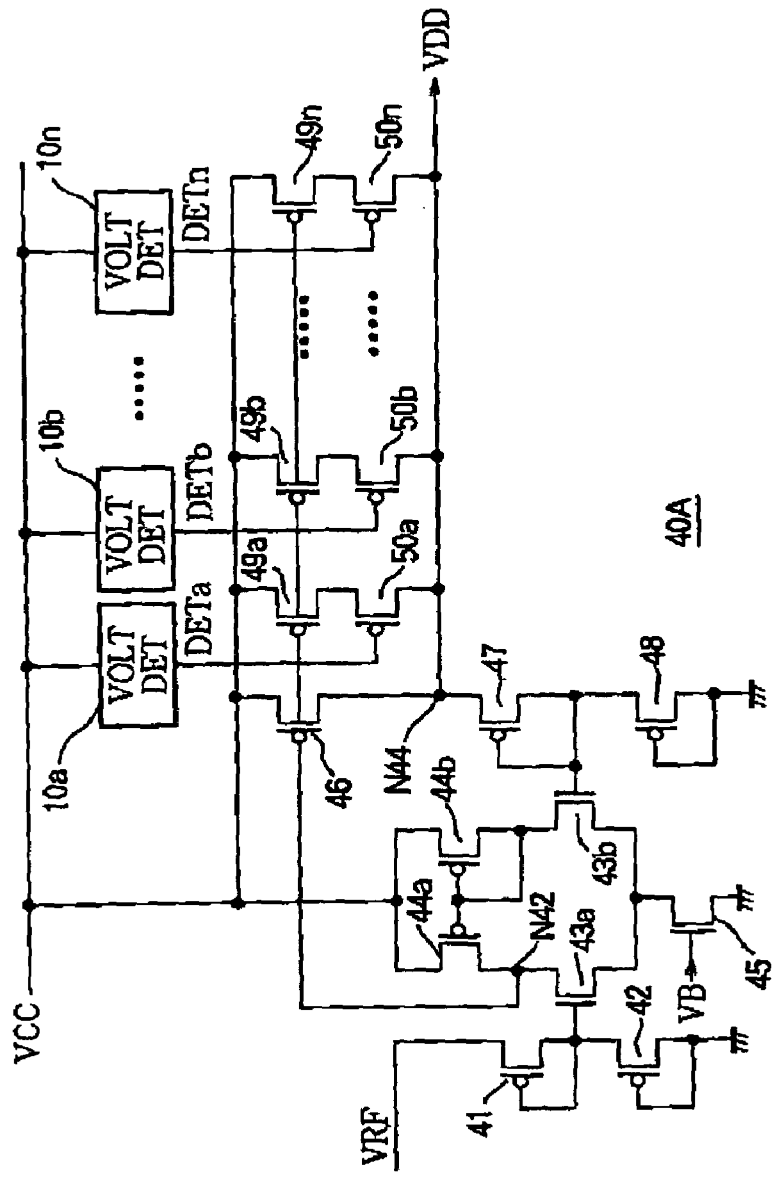
FIG. 3 is a circuit diagram of an internal power supply circuit illustrating a second embodiment of the invention.

FIG. 3 is a circuit diagram showing an internal power supply output unit according to a second embodiment of the present invention. The internal power supply output unit 40 in FIG. 1 is replaced in this embodiment by a different internal power supply output unit 40A.

The internal power supply output unit 40A inserts auxiliary current supply units between the external power supply voltage VCC and the node N44 from which the internal power supply voltage VDD is output. Each of the auxiliary current supply units comprises a PMOS transistor 49*i* for supplying current, where i ranges from a to n, and a PMOS transistor 50*i* connected in series with the PMOS transistor 49*i* for switching the current on and off. The pairs of the PMOS transistors 49*i* and 50*i* are connected in parallel as auxiliary current supply units. A detection signal DETi is supplied to the gate of PMOS transistor 50*i* from a corresponding voltage detector (VOLT DET) 10*i*.

The voltage detectors 10*i* have the same structure as the voltage detector 10 in FIG. 1, but each voltage detector 10*i* detects a different level of the external power supply voltage VCC. Other structures in the internal power supply output unit are the same as in the internal power supply output unit 40 in FIG. 1.

Next, the operation of the internal power supply output unit will be described.

When the external power supply voltage VCC is low, the external power supply voltage VCC is not detected at any of the voltage detectors 10*i*, so the detection signals DETi are all low. All the PMOS transistors 50*i* are therefore turned on, and the on-resistance between the external power supply voltage VCC and node N44 decreases, increasing the current supply capability from the external power supply voltage VCC to node N44.

When the external power supply voltage VCC is detected at some of the voltage detectors 10*i* as the external power supply voltage VCC rises, the detection signals from DETi from these voltage detectors 10*i* go high. The PMOS transistors 50*i* receiving the detection signals DETi at the high level are turned off and the corresponding PMOS transistors 49*i* cease to supply current, but the current supplying capability of the other PMOS transistors 50*i* increases due to the rise in the external power supply voltage VCC, so that the current supply to the internal circuits is not hindered.

When the external power supply voltage VCC rises further and the external power supply voltage VCC is detected at all the voltage detectors 10*i*, all the detection signals DETi at the voltage detectors 10*i* go high. All the PMOS transistors 50*i* are thereby turned off, so that current is supplied from the external power supply voltage VCC to node N44 only through PMOS transistor 46.

As described above, the internal power supply output unit in the second embodiment is configured to have a plurality of auxiliary current supply units that are turned on and off one after another according to the external power supply voltage VCC. With this arrangement, when the external power supply voltage VCC is low and the current supplying capability is small, a large number of auxiliary current supply units are turned on, thereby increasing the available current supply. A reduction in the internal power supply voltage VDD is thereby prevented, so that the operating margin at low voltages can be increased. When the external power supply voltage VCC is high and the current supplying capability is large, only a few of the auxiliary current supply units are turned on, preventing oscillation of the internal power supply voltage VDD due to oversupply of current. The operating margin at high voltages can thereby be increased.

Third Embodiment

Figure 4:
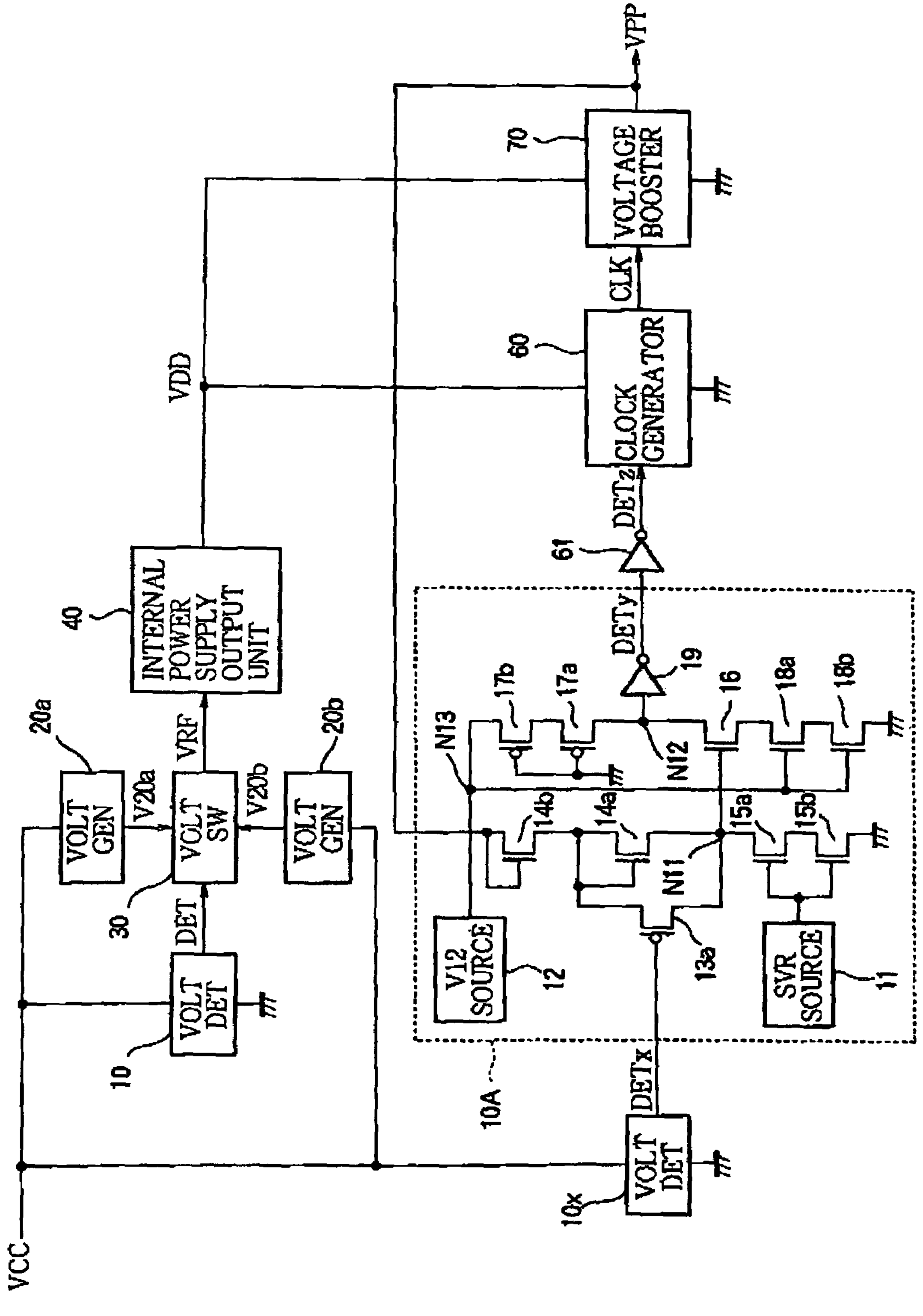
FIG. 4 is a circuit diagram of an internal power supply circuit illustrating a third embodiment of the invention.

FIG. 4 is a circuit diagram showing an internal power supply circuit according to a third embodiment of the present invention.

The internal power supply circuit in this embodiment includes the same voltage detector 10, constant voltage generators (VOLT GEN) 20*a* and 20*b*, voltage switch (VOLT SW) 30, and internal power supply output unit 40 as in FIG. 1; these circuit elements generate an internal power supply voltage VDD for use in a semiconductor integrated circuit from the external power supply voltage VCC. This internal power supply circuit further includes a voltage detector 10*x*, a voltage detector 10A, a clock generator 60, and a voltage booster 70 that boosts the internal power supply voltage VDD to generate a boosted voltage VPP.

Voltage detector 10*x* has the same structure as voltage detector 10 but a lower detection threshold voltage (VDETx) than the detection threshold voltage VDET of voltage detector 10. Voltage detector 10*x* outputs a detection signal DETx to voltage detector 10A indicating whether the external power supply voltage VCC is greater than the detection threshold voltage VDETx.

Voltage detector 10A is generally similar to voltage detector 10, but instead of detecting the level of the external power supply voltage VCC, it detects the level of the boosted voltage VPP, and instead of the PMOS transistor 13 receiving the reference voltage SVR, it has a PMOS transistor 13*a* that receives detection signal DETx at its gate. The drain of PMOS transistor 13*a* is connected to a node N11. Node N11 is connected to the boosted supply voltage VPP through NMOS transistors 14*a* and 14*b*, which are connected as diodes in the forward-biased direction. Node N11 is also connected to ground through NMOS transistors 15*a* and 15*b*, which are connected in series. The reference voltage SVR is supplied to the gates of the NMOS transistors 15*a* and 15*b* from the reference voltage source 11. The source of PMOS transistor 13*a* is connected to the point at which the NMOS transistors 14*a* and 14*b* that function as diodes are interconnected.

As in voltage detector 10, the gate of an NMOS transistor 16 is coupled to node N11, and the drain of NMOS transistor 16 is connected to a node N12. Node N12 is connected to a node N13 through PMOS transistors 17*a* and 17*b*, which are connected in series. The source of NMOS transistor 16 is connected to ground through NMOS transistors 18*a* and 18*b*, which are connected in series. The gates of PMOS transistors 17*a* and 17*b* are coupled to ground, while the gates of the NMOS transistors 18*a* and 18*b* are connected to node N13. The constant voltage V12 is supplied to node N13 from the constant voltage source 12. The input terminal of an inverter 19 is connected to node N12, and a detection signal DETy is supplied from the output terminal of inverter 19.

The detection threshold voltage VDETy of voltage detector 10A differs depending on whether PMOS transistor 13*a* is switched on or off.

The logic level of detection signal DETy is inverted by an inverter 61, and the inverted signal is supplied to the clock generator 60 as a detection signal DETz. The clock generator 60, which operates on the internal power supply voltage VDD, generates an internal clock signal CLK when detection signal DETz is high and halts generation of the internal clock signal CLK when detection signal DETz is low. The output of the clock generator 60 is coupled to the voltage booster 70. The voltage booster 70, which also operates on the internal power supply voltage VDD, boosts this voltage to a boosted voltage VPP and maintains the boosted voltage VPP at a desired level as long as it receives pulses of the internal clock signal CLK. The boosted voltage VPP is supplied to an internal test circuit for use in conducting a stress test, and is also supplied to voltage detector 10A as described before.

Figure 5:
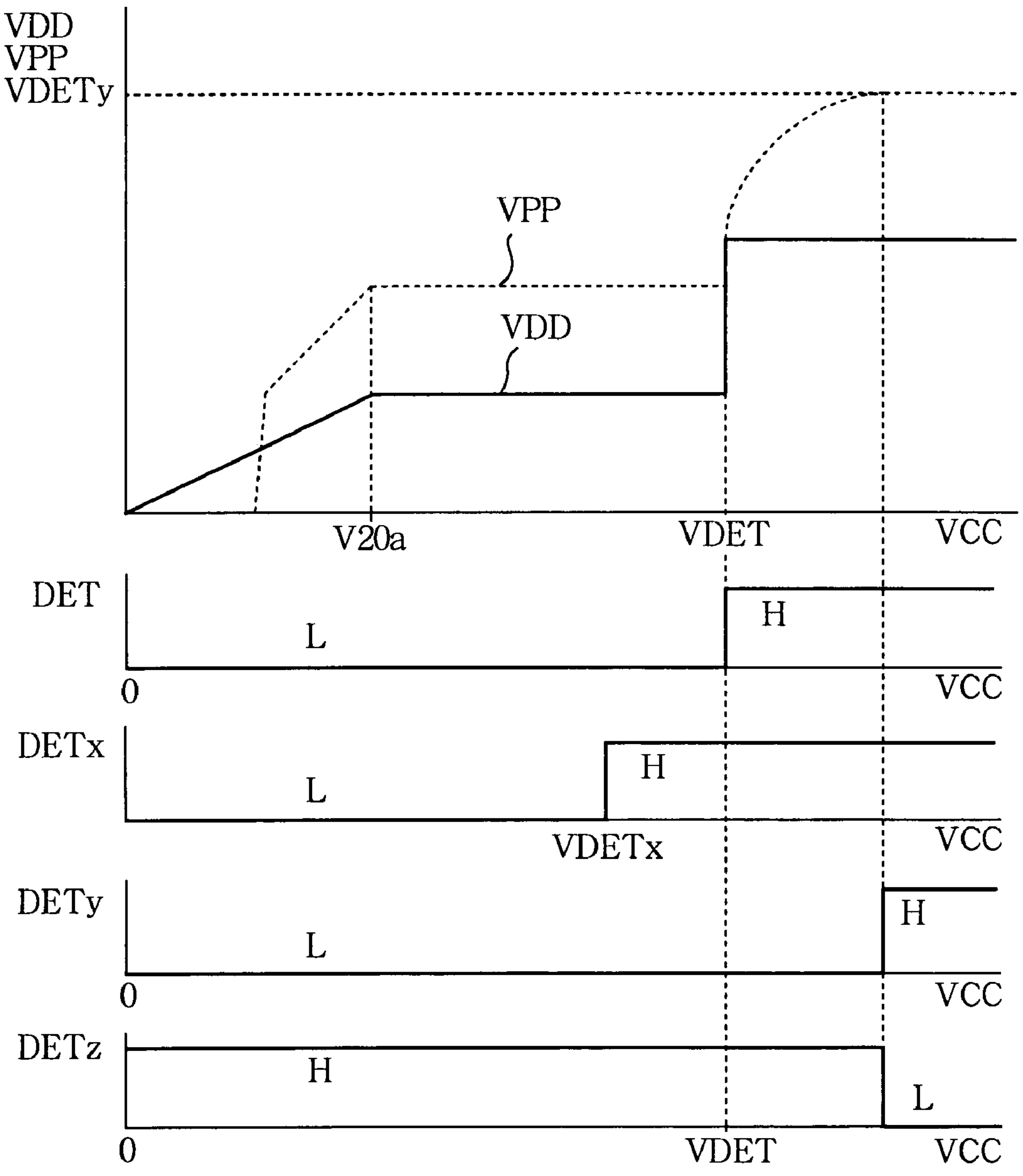
FIG. 5 is a signal waveform diagram illustrating the operation of the circuit in FIG. 4.

FIG. 5 shows waveforms of signals used in the internal power supply circuit in FIG. 4. The operation of the internal power supply circuit in FIG. 4 will be described with reference to FIG. 5.

The voltage detector 10, constant voltage generators 20*a* and 20*b*, voltage switch 30, and internal power supply output unit 40 in FIG. 4 form an internal power supply circuit that generates the internal power supply voltage VDD from the external power supply voltage VCC as in FIG. 1. The generated internal power supply voltage VDD is supplied to the clock generator 60, voltage booster 70, and other internal circuits (not shown).

When the internal power supply voltage VDD has not yet reached the voltage level necessary for normal operation of logic gates such as inverters, the clock generator 60 and the voltage booster 70 do not operate, so that the boosted voltage VPP is not output. When the internal power supply voltage VDD reaches the logic gate operating voltage, the detection signal DETy output from voltage detector 10A still remains low, so the detection signal DETz output from inverter 61 is high. Operation of the clock generator 60 and the voltage booster 70 then begins, so that a voltage VPP that has been boosted in proportion to the internal power supply voltage VDD is output.

When the level of the external power supply voltage VCC exceeds detection threshold voltage VDETx, detection signal DETx switches from low to high, turning off PMOS transistor 13*a* in voltage detector 10A. The detection threshold voltage VDETy of voltage detector 10A is thereby shifted upward, in preparation for boosting the higher level (V20*b*) of the internal power supply voltage VDD. The level of the internal power supply voltage VDD, which is controlled by voltage detector 10, remains unchanged until the external power supply voltage VCC reaches the detection threshold voltage VDET of voltage detector 10, at which point detection signal DET switches from low to high and the level of the internal power supply voltage VDD abruptly rises.

The boosted voltage VPP also rises, boosted by the voltage booster 70. For clarity, a slow rise is shown in FIG. 5. When the boosted voltage VPP reaches the detection threshold voltage VDETy of voltage detector 10A, detection signal DETy goes high, detection signal DETz goes low, the clock generator 60 halts output of the clock signal CLK, and the voltage booster 70 stops boosting the boosted voltage VPP, which remains at the VDETy level. If the boosted voltage VPP later falls below the VDETy level, detection signal DETy will go low, detection signal DETz will go high, the clock generator 60 and voltage booster 70 will resume operation, and VPP will be boosted back to the VDETy level.

As described above, the internal power supply circuit in the third embodiment can maintain the internal power supply voltage VDD at the set voltage, can also generate a boosted voltage VPP higher than the internal power supply voltage VDD, and can control the level to which the boosted voltage VPP is boosted in the burn-in region above VDET, independently of the level to which VPP is boosted in the flat region below VDET. Thus, effective stress can be applied in stress tests.

Fourth Embodiment

Figure 6:
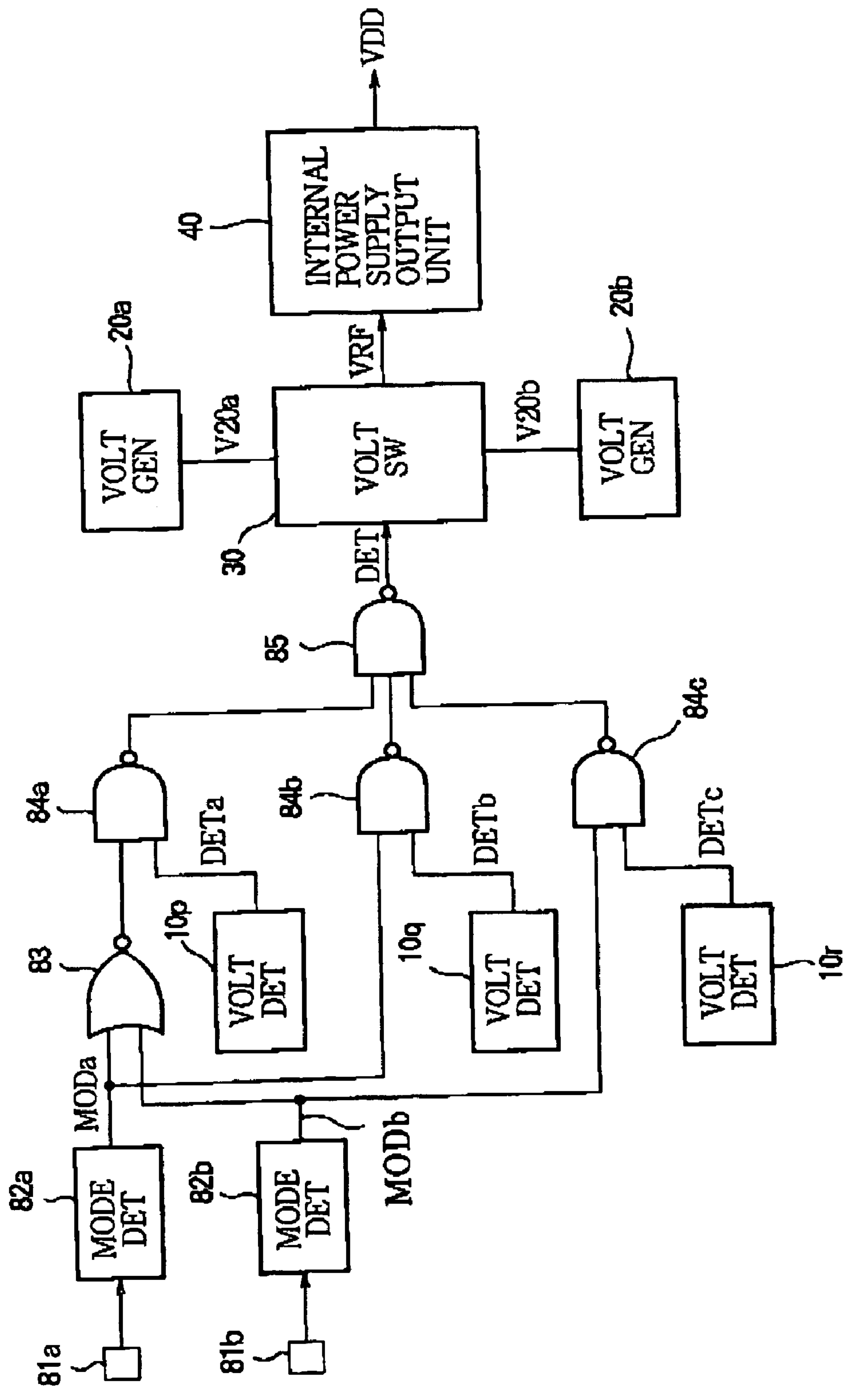
FIG. 6 is a circuit diagram of an internal power supply circuit illustrating a fourth embodiment of the invention.

FIG. 6 is a circuit diagram showing an internal power supply circuit according to a fourth embodiment of the present invention.

The internal power supply circuit includes option pads 81*a* and 81*b* provided on the semiconductor chip on which the internal power supply circuit is formed. When the semiconductor chip is assembled into a semiconductor device, the option pads 81*a* and 81*b* are fixedly connected to either the external power supply voltage VCC (the high logic level) or the ground voltage (the low logic level), thereby selecting an internal operation mode.

Respective mode detectors (MODE DET) 82*a* and 82*b* are coupled to the option pads 81*a* and 81*b*. The option pads 81*a* and 81*b* should be connected so that mode detector 82*a* outputs a mode signal MODa at the high level if the power supply voltage specification for the semiconductor chip is 2 V, and otherwise outputs the low level, while mode detector 82*b* outputs a mode signal MODb at the high level if the power supply voltage specification for the semiconductor chip is 5 V, and otherwise outputs the low level.

The output of mode detector 82*a* is coupled to the first input of a NOR (NOT-OR) gate 83 and the first input of a NAND (NOT-AND) gate 84*b*. The output of mode detector 82*b* is coupled to the second input of the NOR gate 83 and the first input of a NAND gate 84*c*. The output of the NOR gate 83 is coupled to the first input of a NAND gate 84*a*.

The second input of NAND gate 84*a* receives a detection signal DETa from a voltage detector 10*p* that switches the detection signal DETa from low to high at the voltage point appropriate for switching from the flat region to the burn-in region of a 3-V power supply voltage specification. The second input of NAND gate 84*b* receives a detection signal DETb from a voltage detector 10*q* that switches the detection signal DETb from low to high at the appropriate switching point for a 2-V power supply voltage specification. The second input of NAND gate 84*c* receives a detection signal DETc from a voltage detector 10*r* that switches the detection signal DETc from low to high at the appropriate switching point for a 5-V power supply voltage specification.

The outputs of the NAND gates 84*a*, 84*b* and 84*c* are coupled to the inputs of a three-input NAND gate 85. The detection signal DET output from this NAND gate 85 is fed to a voltage switch 30, which is connected to constant voltage generators 20*a*, 20*b* and an internal power supply output unit 40 having the same internal structure as in FIG. 1.

The NOR gate 83, NAND gates 84*a*, 84*b*, 84*c*, and NAND gate 85 form a selector that selects one of the detection signals DETa, DETb, DETc according to the mode signals MODa, MODb.

Next, the operation of the internal power supply circuit in the fourth embodiment will be described.

For the 2-V power supply voltage specification, the option pads 81*a* and 81*b* are connected so that mode signal MODa is high and mode signal MODb is low. The output signal of the NOR gate 83 is therefore also low. The output signals of NAND gates 84*a* and 84*c* are both high. Since the first input to NAND gate 84*b* is high, the detection signal DETb obtained from voltage detector 10*q* is output from NAND gate 85 as the detection signal DET.

For the 5-V power supply voltage specification, the option pads 81*a* and 81*b* are connected so that mode signal MODa is low and mode signal MODb is high. The output signal of the NOR gate 83 is again low. The output signals of NAND gates 84*a* and 84*b* are both high. Since the first input to NAND gate 84*c* is high, the detection signal DETc obtained from voltage detector 10*r* is output from NAND gate 85 as the detection signal DET.

For the 3-V power supply voltage specification, the option pads 81*a* and 81*b* are connected so that mode signals MODa and MODb are both low. The output signal of the NOR gate 83 is now high. The output signals of NAND gates 84*b* and 84*c* are both high. The detection signal DETa obtained from voltage detector 10*p* is output from NAND gate 85 as the detection signal DET.

The voltage switch 30 selects either the voltage V20*a* output by constant voltage generator 20*a* or the voltage V20*b* output by constant voltage generator 20*b* as the reference voltage VRF, according to the detection signal DET output from NAND gate 85. The internal power supply output unit 40 then outputs the internal power supply voltage VDD as in the first embodiment.

As described above, the internal power supply circuit in the fourth embodiment includes option pads 81*a* and 81*b* for selecting one of a plurality of power supply voltage modes, and mode detectors 82*a* and 82*b*. The internal power supply circuit further includes voltage detectors 10_p_ to 10_r_ for the different power supply voltage modes, and logic circuits for selecting one of the detection signals DETa to DETc according to the selected mode. With this arrangement, the transition point between the flat region (VDD=V20_a_) and the burn-in region (VDD=V20_b_) can be readily switched according to the mode, without the need to modify the structure of either constant voltage generator 20_a_ or 20_b_.

The present invention is not limited to the embodiments described above; various modifications are possible. Among these modifications are the following:

(a) The circuit structures of the voltage detectors, constant voltage generators, voltage switch, and internal power supply output unit are not limited to the structures illustrated in the drawings. Any circuits having equivalent functions can be used.

(b) In the internal power supply output unit 40A in FIG. 3, a plurality of voltage detectors 10_a_ to 10_n_ are employed to switch the current supplying capability between multiple levels. Instead of this arrangement, however, a single voltage detector 10_a_ may be used to switch the current supplying capability between two levels.

(c) The internal power supply circuit in FIG. 6 accommodates three power supply voltages, but this arrangement can be altered by increasing or decreasing the number of voltage detectors 10, and a corresponding number of logic gate circuits can be used to accommodate two or four or more power supply voltages.

Those skilled in the art will recognize that further variations are possible within the scope of the invention, which is defined in the appended claims.

What is claimed is:

1. An internal power supply circuit comprising:

a first voltage detector for receiving an external power supply voltage and outputting a first detection signal indicating whether the external power supply voltage is higher than a first voltage;

a first constant voltage generator for generating a first constant voltage from the external power supply voltage;

a second constant voltage generator for generating a second constant voltage from the external power supply voltage, the second constant voltage differing from the first constant voltage, the first constant voltage generator and the second constant voltage generator having identical circuit topologies;

a voltage switch for selecting one of the first constant voltage and the second constant voltage responsive to the first detection signal, and outputting the selected constant voltage as a first reference voltage; and an internal power supply output unit for generating an internal power supply voltage from the external power supply voltage according to the first reference voltage and outputting the internal power supply voltage.

2. The internal power supply circuit of claim 1, wherein each of the first and second voltage generators comprises an n-channel metal-oxide-semiconductor (NMOS) transistor coupled in series with a pair of resistors.

3. The internal power supply circuit of claim 2, wherein the NMOS transistor has a gate connected to a point between the pair of resistors, and a drain connected to one of the resistors, the constant voltage being obtained from the drain.

4. The internal power supply circuit of claim 1, wherein the voltage switch comprises:

a buffer amplifier for outputting the first reference voltage;

a first transmission gate for passing the first constant voltage from the first constant voltage generator to the buffer amplifier under control of the first detection signal; and a second transmission gate for passing the second constant voltage from the second constant voltage generator to the buffer amplifier under complementary control of the first detection signal.

5. The internal power supply circuit of claim 1, wherein the internal power supply output unit comprises:

a differential amplifier having a first input node, a second input node, and an output node;

a first p-channel metal-oxide-semiconductor (PMOS) transistor having a source receiving the first reference voltage from the voltage switch, a gate connected to the first input node of the differential amplifier, and a drain connected to the first input node of the differential amplifier;

a second PMOS transistor having a source connected to the first input node of the differential amplifier, a gate connected to a ground potential, and a drain connected to the ground potential;

a third PMOS transistor having a source receiving the external power supply voltage, a gate connected to the output node of the differential amplifier, and a drain for output of the internal power supply voltage;

a fourth PMOS transistor having a source connected to the drain of the third PMOS transistor, a gate connected to the second input node of the differential amplifier, and a drain connected to the second input node of the differential amplifier; and a fifth PMOS transistor having a source connected to the second input node of the differential amplifier, a gate connected to the ground potential, and a drain connected to the ground potential.

6. The internal power supply circuit of claim 5, wherein the differential amplifier comprises:

a sixth PMOS transistor having a source receiving the external power supply voltage, a gate, and a drain connected to the output node of the differential amplifier;

a seventh PMOS transistor having a source receiving the external power supply voltage, a gate connected to the gate of the sixth PMOS transistor, and a drain connected to the gate of the sixth PMOS transistor;

a first NMOS transistor having a source, a gate connected to the first input node of the differential amplifier, and a drain connected to the drain of the sixth PMOS transistor;

a second NMOS transistor having a source, a gate connected to the second input node of the differential amplifier, and a drain connected to the drain of the seventh PMOS transistor; and a third NMOS transistor having a source connected to the ground potential, a gate receiving a bias voltage, and a drain connected to the source of the first and second NMOS transistors.

7. The internal power supply circuit of claim 1, wherein the first voltage detector comprises:

a reference voltage source for outputting a second reference voltage;

a constant voltage source for outputting a third constant voltage;

an inverter for outputting the first detection signal;

a first plurality of transistors coupled in series between the external power supply voltage and a ground potential, one of the first plurality of transistors being a PMOS transistor having a gate and a drain, the gate being connected to the reference voltage source; and a second plurality of transistors coupled in series between the constant voltage source and the ground potential, one of the second plurality of transistors being an NMOS transistor having a gate connected to the drain of the PMOS transistor in the first plurality of transistors, and a drain connected to the inverter.

8. The internal power supply circuit of claim 1, wherein the internal power supply output unit comprises:

a differential amplifier having an output node;

a first transistor having a control terminal connected to the output node of the differential amplifier and an output terminal from which the internal power supply voltage is output;

a second voltage detector for detecting whether the external power supply voltage is higher than a second voltage; and an auxiliary current supply unit including a second transistor and a third transistor connected in series between the external power supply voltage and the output terminal of the first transistor, the second transistor having a control terminal connected to the output node of the differential amplifier, the third transistor having a control terminal connected to the second voltage detector.

9. The internal power supply circuit of claim 1, further comprising:

a voltage booster for receiving a clock signal and the internal power supply voltage and generating a boosted voltage by using the clock signal to boost the internal power supply voltage;

a second voltage detector for receiving the external power supply voltage and outputting a second detection signal indicating whether the external power supply voltage is higher than a second voltage, the second voltage being lower than the first voltage;

a third voltage detector for receiving the second detection signal and outputting a third detection signal indicating whether the boosted voltage is higher than a third voltage when the second detection signal indicates that the external power supply voltage is higher than the second voltage; and a clock generator driven by the internal power supply voltage, for generating the clock signal responsive to the third detection signal.

10. The internal power supply circuit of claim 9, wherein the third voltage detector comprises:

a constant voltage source for outputting a third constant voltage;

a reference voltage source for outputting a second reference voltage;

an inverter for outputting the third detection signal;

a first plurality of transistors coupled in series between the boosted voltage and a ground potential, one of the first plurality of transistors being a PMOS transistor having a gate and a drain, the gate being connected to the second voltage detector;

an additional transistor connected in parallel with the PMOS transistor in the first plurality of transistors, the additional transistor having a gate and a drain, the gate and the drain of the additional transistor being mutually interconnected; and a second plurality of transistors coupled in series between the constant voltage source and the ground potential, one of the second plurality of transistors being an NMOS transistor having a gate connected to the drain of the PMOS transistor in the first plurality of transistors, and a drain connected to the inverter.

11. An internal power supply circuit for generating an internal power supply voltage from an external power supply voltage that may have different specified voltage levels, the internal power supply circuit comprising:

at least one mode detector for receiving a fixed logic level and thereby generating a mode selection signal indicating one of the different specified voltage levels;

a plurality of voltage detectors for detecting whether the external power supply voltage is higher than different predetermined voltages corresponding to the different specified voltage levels and outputting respective detection signals;

a selector for selecting one of the detection signals according to the mode selection signal;

a first constant voltage generator for generating a first constant voltage from the external power supply voltage;

a second constant voltage generator for generating a second constant voltage from the external power supply voltage, the second constant voltage differing from the first constant voltage, the first constant voltage generator and the second constant voltage generator having identical circuit topologies;

a voltage switch for selecting one of the first constant voltage and the second constant voltage responsive to the detection signal selected by the selector, and outputting the selected constant voltage as a reference voltage; and an internal power supply output unit for generating an internal power supply voltage from the external power supply voltage according to the reference voltage and outputting the internal power supply voltage.

* * * * *